(12) United States Patent
Aibara et al.

(10) Patent No.: US 12,255,041 B2
(45) Date of Patent: Mar. 18, 2025

(54) ELECTRON MICROSCOPE AND METHOD OF CORRECTING ABERRATION

(71) Applicant: JEOL Ltd., Tokyo (JP)

(72) Inventors: Keito Aibara, Tokyo (JP); Tomohiro Nakamichi, Tokyo (JP); Shigeyuki Morishita, Tokyo (JP); Motofumi Saito, Tokyo (JP); Ryusuke Sagawa, Tokyo (JP); Fuminori Uematsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 484 days.

(21) Appl. No.: 17/869,117

(22) Filed: Jul. 20, 2022

(65) Prior Publication Data

US 2023/0026970 A1  Jan. 26, 2023

(30) Foreign Application Priority Data

Jul. 21, 2021 (JP) .................................. 2021-120564

(51) Int. Cl.
*H01J 37/153* (2006.01)
*H01J 37/244* (2006.01)
*H01J 37/28* (2006.01)

(52) U.S. Cl.
CPC .......... *H01J 37/153* (2013.01); *H01J 37/244* (2013.01); *H01J 37/28* (2013.01); *H01J 2237/1534* (2013.01); *H01J 2237/2802* (2013.01); *H01J 2237/2804* (2013.01)

(58) Field of Classification Search
CPC ........ H01J 37/153; H01J 37/244; H01J 37/28; H01J 2237/1534; H01J 2237/2802; H01J 2237/2804
See application file for complete search history.

(56) References Cited

U.S. PATENT DOCUMENTS

2007/0120055 A1   5/2007   Sawada et al.

FOREIGN PATENT DOCUMENTS

| JP | 2003331773 A | 11/2003 |
|----|--------------|---------|
| JP | 2006173027 A | 6/2006  |
| JP | 2007180013 A | 7/2007  |
| JP | 4790567 B2   | 10/2011 |
| JP | 4891736 B2   | 3/2012  |

OTHER PUBLICATIONS

Office Action issued in JP2021120564 on Aug. 8, 2023.
Extended European Search Report issued in EP22183109.2 on Feb. 1, 2023.
(Continued)

*Primary Examiner* — Nicole M Ippolito
*Assistant Examiner* — Hanway Chang
(74) *Attorney, Agent, or Firm* — The Webb Law Firm

(57) ABSTRACT

Prior to execution of primary correction, a first centering process, an in-advance correction of a particular aberration, and a second centering process are executed stepwise. In the first centering process and the second centering process, a ronchigram center is identified based on a ronchigram variation image, and is matched with an imaging center. In the in-advance correction and the post correction of the particular aberration, a particular aberration value is estimated based on a ronchigram, and the particular aberration is corrected based on the particular aberration value.

11 Claims, 11 Drawing Sheets

(56) References Cited

OTHER PUBLICATIONS

Schnitzer et al., Introduction to the Ronchigram and its Calculation with Ronchigram.com, Microscopy Today, May 2019, pp. 12-15.

Schnitzer et al., Optimal STEM Convergence Angle Selection using a Convolutional Neural Network and the Strehl Ratio, Microscopy and Microanalysis, Jul. 2020, pp. 1-28.

Lupini and Pennycook, Rapid Methods for Dynamic Autotuning, Microscopy and Microanalysis, 2010, vol. 16 (Suppl 2), pp. 244-245.

P.W. Hawkes, The correction of electron lens aberrations, Ultramicroscopy, 2015, vol. 156, pp. A1-A64.

Sawada et al., Achieving 63 pm Resolution in Scanning Transmission Electron Microscope with Spherical Aberration Corrector, Japanese Journal of Applied Physics, 2007, vol. 46, No. 23, pp. L568-L570.

Kaneyama et al., Design and Development of 300 kV Super-High Resolution FETEM "R005", 2006, Proceedings/16th International Microscopy Congress, 1 page.

Schnitzer et al., Maximal Resolution from the Ronchigram: Human vs, Deep Learning, Microscopy and Microanalysis, 2019, vol. 25 (Suppl 2), pp. 160-161.

Sawada et al., Measurement method of aberration from Ronchigram by autocorrelation function, Ultramicroscopy, 2008, vol. 108, pp. 1467-1475.

ELECTRON MICROSCOPE AND METHOD OF CORRECTING ABERRATION

CROSS REFERENCE TO RELATED APPLICATION

This application claims priority to Japanese Patent Application No. 2021-120564 filed on Jul. 21, 2021, the disclosure of which is hereby incorporated by reference in its entirety.

BACKGROUND

Field of the Disclosure

The present disclosure relates to an electron microscope and a method of correcting aberration, and in particular to aberration correction based on a ronchigram.

Description of Related Art

In electron microscopes, in particular, in scanning transmission electron microscopes (STEM) having high spatial resolution, in order to sufficiently narrow a focal point of an electron beam (electron probe), aberration correction is necessary. Known aberrations caused in electron microscopes include spherical aberration, astigmatism, coma aberration, and others.

In a scanning transmission electron microscope, in general, an aberration corrector is provided. The aberration corrector includes, for example, a plurality of multipoles and a plurality of transfer lenses. Each individual multipole is, for example, a hexapole. A three-fold symmetry field is formed by the hexapole. Here, an "n-fold symmetry" means that, in a rotation of (360/n) degrees for a certain figure, the figure after the rotation overlaps the figure before the rotation.

For the aberration correction, normally, a ronchigram is acquired. The ronchigram is a projected image generated as a result of illumination of an electron beam onto a region having a non-regular, random atomic arrangement (more specifically, an amorphous region). In the ronchigram, there appear patterns which reflect various aberrations caused by the electron beam illumination system (in particular, the objective lens). During the aberration correction, the ronchigram is analyzed, to calculate an aberration value matrix formed from a plurality of aberration values. Based on the aberration value matrix, excitation currents supplied to the aberration corrector are controlled.

Document 1 and Document 2 disclose an SRAM (Segmented Ronchigram Auto-correction function Matrix) method for calculating the aberration value matrix. In the SRAM method, for example, a first ronchigram which is acquired under an under-focus condition and a second ronchigram which is acquired under an over-focus condition are analyzed. For each individual ronchigram, a two-dimensional segment array is set, and, for each individual segment, an autocorrelation function is calculated. The aberration value matrix is calculated based on a plurality of autocorrelation functions calculated from the first ronchigram and a plurality of autocorrelation functions calculated from the second ronchigram.

Document 3 discloses another method for calculating the aberration value matrix based on the ronchigram. Document 4 discloses several techniques for matching a ronchigram center with an imaging center. None of the documents discloses a structure or method for integrally solving the problems to be described below. That is, none of the documents discloses a combination of an in-advance adjustment of the ronchigram center and an in-advance adjustment of a particular aberration.

CITATION LIST

Document 1: H. Sawada, et al., Measurement method of aberration from Ronchigram by autocorrelation function, Ultramicroscopy 108, 2008, pp. 1467-1475.
Document 2: JP 4790567 B
Document 3: JP 2006-173027 A
Document 4: JP 4891736 B Several methods are proposed for calculating the aberration value matrix based on the ronchigram. However, depending on the situation of acquisition of the ronchigram, these methods may not function well. In particular, when the ronchigram center is significantly deviated from the imaging center, calculation precision of the aberration value matrix may be reduced. Further, when a large particular aberration is present, calculation precision of the aberration value matrix or the particular aberration value may be reduced.

In consideration of this, if an in-advance adjustment of the ronchigram center and an in-advance adjustment of the particular aberration are to be requested to the user, a large burden is imposed on the user. To begin with, when various aberrations are reflected in the ronchigram, visually identifying the ronchigram center and manually adjusting the particular aberration become impossible.

SUMMARY

An advantage of the present disclosure lies in improvement of precision of correction of aberrations in an electron microscope. Alternatively, an advantage of the present disclosure lies in reduction of the burden of the user in correcting the aberrations. Further, an advantage of the present disclosure lies in appropriate functioning of an algorithm for calculating the aberration value matrix.

According to one aspect of the present disclosure, there is provided an electron microscope comprising: an imaging unit that acquires a ronchigram generated as a result of illumination of an electron beam onto a sample; a centering unit that controls a centering process to match a ronchigram center with an imaging center based on a ronchigram acquired by the imaging unit; an in-advance correction unit that controls an in-advance correction of a particular aberration caused in an electron beam illumination system, based on a ronchigram acquired by the imaging unit after the centering process; and a primary correction unit that controls correction of a group of aberrations formed from a plurality of aberrations caused in the electron beam illumination system, based on a ronchigram acquired by the imaging unit after the in-advance correction of the particular aberration.

According to another aspect of the present disclosure, there is provided a method of correcting aberration, the method comprising: controlling a centering process to match a ronchigram center with an imaging center based on a ronchigram acquired as a result of illumination of an electron beam onto a sample; controlling an in-advance correction of a particular aberration caused in an electron beam illumination system, based on a ronchigram acquired after the centering process; and controlling correction of a group of aberrations formed from a plurality of aberrations caused in the electron beam illumination system, based on a ronchigram acquired after the in-advance correction of the particular aberration.

BRIEF DESCRIPTION OF DRAWINGS

Embodiment(s) of the present disclosure will be described based on the following figures, wherein.

DESCRIPTION OF EMBODIMENTS

Figure 1:
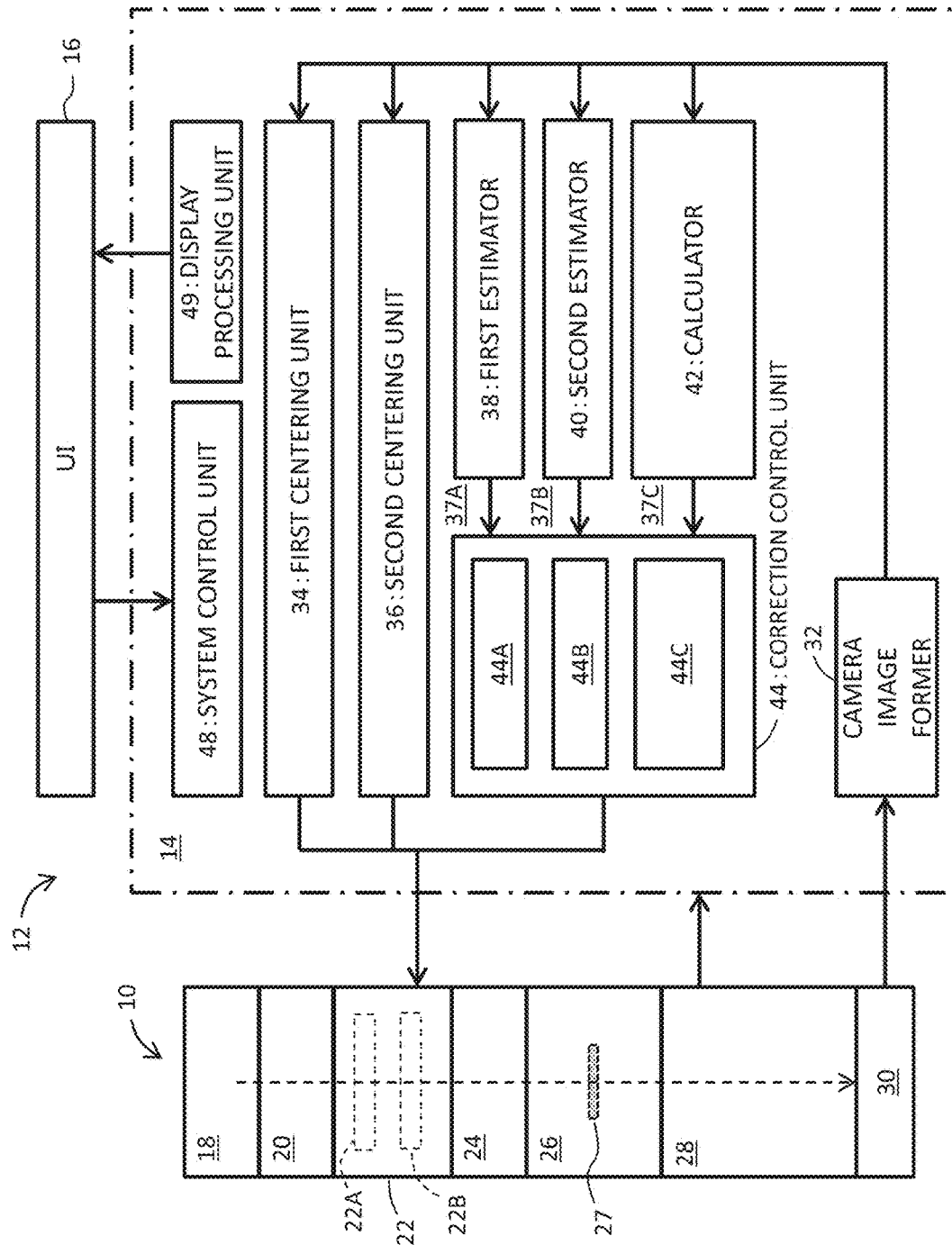
FIG. 1 is a conceptual diagram showing an electron microscope according to an embodiment of the present disclosure.

An embodiment of the present disclosure will now be described with reference to the drawings.

(1) Overview of Embodiment

An electron microscope according to an embodiment of the present disclosure comprises an imaging unit, a centering unit, an in-advance correction unit, and a primary correction unit. The imaging unit acquires a ronchigram generated as a result of illumination of an electron beam onto a sample. The centering unit controls a centering process to match a ronchigram center with an imaging center based on a ronchigram acquired by the imaging unit. The in-advance correction unit controls an in-advance correction of a particular aberration caused during formation of the electron beam, based on a ronchigram acquired by the imaging unit after the centering process. The primary control unit controls correction of a group of aberrations formed from a plurality of aberrations caused during the formation of the electron beam, based on a ronchigram acquired by the imaging unit after the in-advance correction of the particular aberration.

According to the above-described structure, a ronchigram supplied to the primary correction unit can be made more appropriate or improved by the in-advance centering process and the in-advance correction of the particular aberration, and, as a result, precision of calculation of the aberration value matrix by the primary correction unit can be improved; that is, correction precision of the group of aberrations can be improved. In the correction of the group of aberrations, no particular burden is imposed on the user. From a different perspective, the above-described structure partially adjusts an observation unit (electron beam illumination system) in advance before the primary correction unit functions, so as to compensate for a disadvantage of the primary correction unit, which is not necessarily all-round.

In general, when only one of the in-advance centering process and the in-advance correction of the particular aberration is executed, the calculation precision of the aberration value matrix cannot be sufficiently improved. Thus, desirably, both the in-advance centering process and the in-advance correction of the particular aberration are executed; that is, a combination of these processes is executed. Moreover, in general, in the ronchigram supplied to the in-advance correction unit, when the ronchigram center is significantly deviated from the imaging center, the in-advance correction of the particular aberration cannot be executed, and the precision of the in-advance correction is reduced. The centering process is the most basic in-advance adjustment, and desirably, the in-advance centering process is executed first, and then the in-advance correction of the particular aberration is executed.

The particular aberration described above is, for example, the coma aberration, and is more specifically a second-order coma aberration (the ordinal number indicates an order viewed from the viewpoint of geometrical aberration). The group of aberrations described above is formed from, for example, five aberrations, six aberrations, or a higher number of aberrations. The particular aberration may be included in the group of aberrations described above. The ronchigram center may also be called an aberration center or the center of a focal point of the electron beam. The imaging center may also be called a camera center.

An electron microscope according to an embodiment of the present disclosure further includes a fine centering unit. The fine centering unit controls a fine centering process to match the ronchigram center with the imaging center based on a ronchigram acquired by an imaging unit after the in-advance correction of the particular aberration. The primary correction unit controls the correction of the group of aberrations based on a ronchigram acquired by the imaging unit after execution of the in-advance correction of the particular aberration and the fine centering process.

At the time when an aberration correction process is started, in many cases, the ronchigram center is significantly deviated from the imaging center. In such a situation, execution of the fine centering process from the beginning is not possible. In contrast, with the above-described structure, a ronchigram which has undergone certain in-advance adjustment can be supplied to the fine centering unit, and, therefore, suitable execution of the fine centering process can be expected. Further, with the above-described structure, because the ronchigram to be supplied to the primary correction unit can be improved to a higher degree, the precision of the calculation of the aberration value matrix can be further improved. The centering unit corresponds to a first centering unit to be described later. The fine centering unit corresponds to a second centering unit to be described later.

In an embodiment of the present disclosure, the centering unit determines the ronchigram center based on a first ronchigram variation image acquired while a defocus value is changed within a first defocus range. The fine centering unit determines the ronchigram center based on a second ronchigram variation image acquired while the defocus value is changed in a second defocus range which is smaller than the first defocus range. The first defocus range is for coarse adjustment, and the second defocus range is for fine adjustment.

An electron microscope according to an embodiment of the present disclosure includes a post correction unit that controls a post correction of the particular aberration based on a ronchigram acquired by the imaging unit after the correction of the group of aberrations. With this structure, when the calculation precision of the particular aberration value in the primary correction unit is low, the disadvantage can be compensated for. Alternatively, the calculation function of the primary correction unit can be supplemented.

In an embodiment of the present disclosure, the in-advance correction unit includes a first estimator which has a first estimation model which has undergone a first machine learning process and which estimates a first particular aberration value, and a first control device which controls the in-advance correction of the particular aberration based on the first particular aberration value. The post correction unit includes a second estimator which has a second estimation model which has undergone a second machine learning process and which estimates a second particular aberration value, and a second control device which controls the post correction of the particular aberration based on the second particular aberration value.

In an embodiment of the present disclosure, a training data set for machine learning may be prepared presuming the in-advance centering process. It becomes unnecessary to generate or collect a large number of ronchigrams having a large center deviation when generating or collecting the training data set. Thus, the volume of training data forming the training data set may be reduced or the training data set can be easily generated or collected.

An electron microscope according to an embodiment of the present disclosure includes a display processing unit that generates a setting screen for setting the first defocus range and the second defocus range. An electron microscope according to an embodiment of the present disclosure includes a display processing unit that generates a setting screen for setting a completion condition for the in-advance correction of the particular aberration, and for setting a completion condition for the post correction of the particular aberration. In an embodiment of the represent disclosure, whether or not execution of a step is necessary can be chosen for each step on the setting screen. That is, the contents of the aberration correction process can be customized according to the situation. Alternatively, an order of execution of a plurality of steps may be changed. For example, alternative configurations may be considered in which the centering process is executed after the in-advance correction of the particular aberration, and in which the centering process and the fine centering process are consecutively executed.

In an embodiment of the present disclosure, the primary correction unit includes a calculator which executes an algorithm for calculating an aberration value matrix for the group of aberrations based on a ronchigram acquired by the imaging unit after the in-advance correction of the particular aberration, and a control device which controls the correction of the group of aberrations based on the aberration value matrix. As an example of the algorithm, the SRAM method described above may be exemplified. Alternatively, the primary correction unit may execute other algorithms.

A method of correcting aberration according to an embodiment of the present disclosure includes a centering step, an in-advance correction step, and a primary correction step. In the centering step, a centering process to match a ronchigram center with an imaging center is controlled based on a ronchigram acquired as a result of illumination of an electron beam onto a sample. In the in-advance correction step, an in-advance correction of a particular aberration caused in an electron beam illumination system is controlled based on a ronchigram acquired after the centering process.

In the primary correction step, correction of a group of aberrations formed from a plurality of aberrations caused in the electron beam illumination system is controlled based on a ronchigram acquired after the in-advance correction of the particular aberration.

The above-described method may be realized as a function of hardware or as a function of software. In the latter case, a program for executing the method is installed in an information processing apparatus via a network or a transportable recording medium. The concept of the information processing apparatus encompasses a computer, an electron microscope, an electron microscope system, or the like. The information processing apparatus includes a non-transitory recording medium storing the program.

(2) Details of Embodiment

FIG. 1 shows an electron microscope according to an embodiment of the present disclosure. The electron microscope is more specifically a scanning transmission electron microscope (STEM) having high resolution. The electron microscope has an observation unit 10 and an information processing device 12.

The observation unit 10 includes an electron gun 18, a focusing lens 20, an aberration corrector 22, a deflection scanner 24, an objective lens 26, an imaging-system lens 28, and a camera 30, arranged along an optical axis. An electron beam is generated by the electron gun 18, and passes through the aberration corrector 22 via the focusing lens 20. The focusing lens 20 includes an aperture.

The aberration corrector 22 realizes a function to cancel out a plurality of aberrations caused in the objective lens 26 or in an electron beam illumination system including the objective lens 26. Ideally, the aberration correction is executed so that the electron beam is focused to one point at a focal point on a sample 27.

The aberration corrector 22 has a plurality of elements arranged along the optical axis, including a plurality of multipoles and a plurality of transfer lenses. In the present embodiment, two hexapoles 22A and 22B are provided in the aberration corrector 22. Each of the hexapoles 22A and 22B generates a three-fold symmetry field.

As aberrations that can be corrected by the aberration corrector 22, there may be exemplified a two-fold astigmatism, a second-order coma aberration, a three-fold astigmatism, a third-order spherical aberration, a third-order star aberration, a four-fold astigmatism, a fourth-order coma aberration, a fourth-order three-lobe aberration, a five-fold astigmatism, a fifth-order spherical aberration, and the like (the ordinal number indicates the order viewed from the viewpoint of geometric aberration). An operation of the aberration corrector 22 is controlled by controlling a group of excitation currents supplied to the aberration corrector 22.

The sample 27 is placed in the objective lens 26. In the illustrated example structure, the objective lens 26 forms a magnetic field at a page-front side and at a page-back side of the sample 27. The sample 27 is held on a holding device, whose illustration is omitted. During the aberration correction; that is, during ronchigram acquisition, a spot mode is selected, and an electron beam is illuminated onto an amorphous portion of the sample 27. Alternatively, an amorphous portion may be provided on a member (for example, a grid) holding the sample 27, and the electron beam may be illuminated thereto. The structures from the electron gun 18 to the objective lens 26 correspond to an illumination unit or an illumination means.

The imaging-system lens 28 includes an intermediate lens, a projection lens, or the like. The camera 30 is an imaging unit, and is formed from, for example, a CCD camera. With the camera 30, the electrons transmitting through the sample 27 are detected. The camera 30 has an imaging center (camera center). An optical axis passes through the imaging center, and the imaging center is an immovable, fixed point. During the aberration correction, with the camera 30, a ronchigram is imaged as a projected image of the amorphous region.

A plurality of detectors are provided between the objective lens 26 and the camera 30, but illustration of the detectors is omitted. Based on an output signal from each of the detectors, a two-dimensional image of the sample 27 is generated, or analysis of the sample 27 is executed.

For the centering process to match the ronchigram center with the imaging center, for example, the deflection scanner 24 is controlled. Alternatively, the centering process may be executed by other methods. The ronchigram center is also called an aberration center.

The information processing device 12 is formed from a computer. Alternatively, the information processing device 12 may be formed from a plurality of computers connected to each other via a network.

The information processing device 12 includes an information processing unit (calculation controlling unit) 14 and a user interface (UI) 16. The information processing unit 14 includes a processor which executes a program. The processor is, for example, a CPU. The UI 16 includes an inputter and a display. The inputter is, for example, a keyboard. The display is, for example, an LCD. In FIG. 1, a plurality of functions realized by the processor are represented by a plurality of blocks.

A camera image former 32 forms a camera image having a predetermined format, based on an output signal from the camera 30. The camera image former 32 functions as a camera controller. When the electron beam is illuminated onto the amorphous region, a camera image representing the ronchigram (in the following, the image will also be called the ronchigram) is formed. With progress of the aberration correction process, a plurality of ronchigrams are sequentially acquired. In the illustrated example structure, each ronchigram is sent to a first estimator 38, a second estimator 40, or a calculator 42.

The camera image former 32 of the present embodiment also has a function to form a ronchigram variation image. The ronchigram variation image is an accumulated image formed from a plurality of ronchigrams, or consecutively imaged images corresponding to a ronchigram video image. A method of generating the ronchigram variation image will be described later in detail. When the first centering process is executed, the ronchigram variation image is sent to a first centering unit 34. When the second centering process is executed, the ronchigram variation image is sent to a second centering unit 36. Alternatively, the ronchigram variation image may be formed in the first centering unit 34 and the second centering unit 36.

The first centering unit 34 controls a centering process for matching the ronchigram center with the imaging center (coarse centering) based on the ronchigram variation image at a starting stage of the aberration correction process. The second centering unit controls a centering process for matching the ronchigram center with the imaging center (fine centering) based on the ronchigram variation image at an intermediate stage of the aberration correction process, more specifically, immediately before a primary correction step.

The first centering unit 34 may also be called a primary centering unit, an initial centering unit, or a coarse centering unit. The second centering unit 36 may also be called a secondary centering unit, a re-centering unit, or a fine centering unit. Each of the first centering unit 34 and the second centering unit 36 has a function to calculate a deviation of the center based on the ronchigram variation image, and a function to execute control to move the ronchigram center to the imaging center based on the deviation of the center. Alternatively, the first centering unit 34 and the second centering unit 36 may be integrated, to form a single centering unit.

The information processing unit 14 has an in-advance correction unit 37A, a post correction unit 37B, and a primary correction unit 37C. The in-advance correction unit 37A controls an in-advance correction of a particular aberration, and the post correction unit 37B controls a post correction of a particular aberration. The primary correction unit 37C controls correction of a group of aberrations (primary correction).

In the illustrated example structure, the in-advance correction unit 37A is formed from the first estimator 38 and a first control device 44A. The post correction unit 37B is formed from the second estimator 40 and a second control device 44B. The primary correction unit 37C is formed from the calculator 42 and a third control device 44C. The first control device 44A, the second control device 44B, and the third control device 44C form a correction control unit 44. Each of these elements will now be described in detail.

The first estimator 38 estimates, during the in-advance correction of the particular aberration, an aberration value of the particular aberration based on the ronchigram. The second estimator 40 estimates, during the post correction of the particular aberration, an aberration value of the particular aberration based on the ronchigram. The calculator 42 functions during the primary correction, and calculates an aberration value matrix based on the ronchigram. In the present embodiment, the aberration value matrix is calculated based on the SRAM method described above.

The correction control unit 44 controls an operation of the aberration corrector 22, and more specifically controls a group of excitation currents to be supplied to the aberration controller 22. The first control device 44A controls the operation of the aberration corrector 22 such that an estimated particular aberration value is reduced during the in-advance correction of the particular aberration. The second control device 44B controls the operation of the aberration corrector 22 such that an estimated particular aberration value is reduced during the post correction of the particular aberration. The third control device 44C controls the operation of the aberration corrector 22 such that each aberration value of the aberration value matrix which is calculated is reduced during the correction of the group of aberrations. Alternatively, during the aberration correction, structures other than the aberration corrector 22 may be adjusted. For example, an operation of the deflection scanner 24 or the like may be controlled.

A system control unit 48 controls operations of a plurality of constituting elements of the information processing unit 14. The UI 16 is connected to the system control unit 48. A user may set an aberration correction condition on a setting image displayed on the UI 16. The system control unit 48 controls operations of the constituting elements based on the set aberration correction condition. The system control unit 48 controls execution of the aberration correction process.

A display processing unit 49 generates the above-described setting image. Data indicating the setting image are output to the UI 16. Also, data indicating the STEM image or the like are output to the UI 16.

Figure 2:
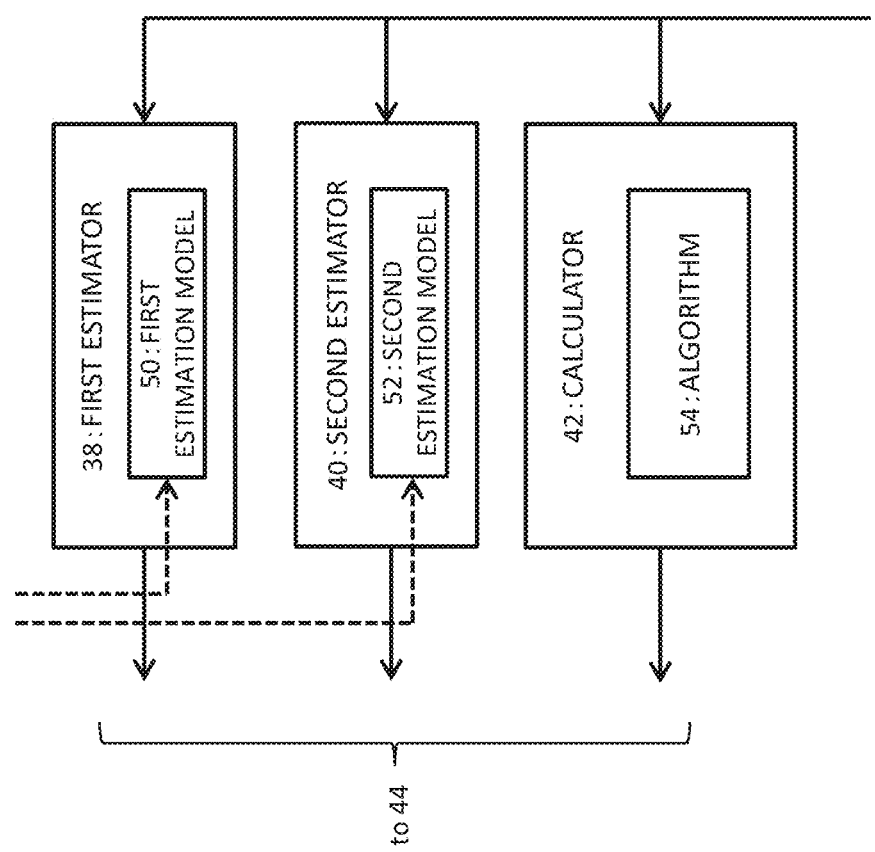
FIG. 2 is a block diagram a specific example structure of a part of the electron microscope.

FIG. 2 shows example structures of the first estimator 38, the second estimator 40, and the calculator 42.

The first estimator 38 has a first estimation model 50 generated after undergoing a machine learning process. During the in-advance correction of the particular aberration, the ronchigram is input to the first estimation model 50, and a particular aberration value is output from the first estimation model 50. The second estimator 40 has a second estimation model 52 generated after undergoing a machine learning process. During the post correction of the particular aberration, a ronchigram is input to the second estimation model 52, and a particular aberration value is output from the second estimation model 52. Each of the first estimator 38 and the second estimator 40 is a machine-learning type estimator, and is formed from, for example, a CNN (Convolutional Neural Network).

The calculator 42 has an algorithm 54. A substance of the algorithm 54 is a program which calculates an aberration coefficient matrix based on one or a plurality of ronchigrams. In the present embodiment, the algorithm 54 is an algorithm according to the SRAM method.

Figure 3:
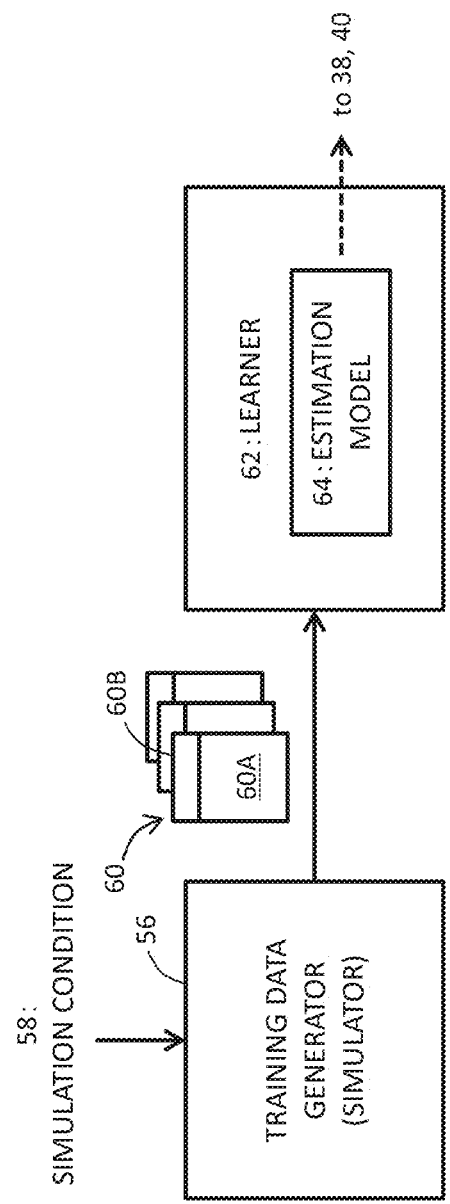
FIG. 3 is a conceptual diagram showing a method of generating an estimation model.

FIG. 3 shows a method of generating the first estimation model and the second estimation model. In FIG. 3, the first estimation model and the second estimation model are represented as an estimation model 64. A training data generator 56 is a simulator which generates a ronchigram. The training data generator 56 sequentially generates training data 60 according to a simulation condition 58, while changing the simulation condition 58. Each set of training data 60 is formed from a ronchigram 60A and a particular aberration value 60B corresponding thereto. The ronchigram 60A is used as input data, and the particular aberration value 60B is used as ground truth data.

In the present embodiment, because a plurality of sets of training data 60 can be generated while not presuming a center deviation or while presuming a small center deviation, a size of the training data set for the machine learning can be reduced, and a generation time of the training data set for the machine learning can be shortened.

A learner 62 is formed from, for example, the CNN, and has the estimation model 64. A plurality of sets of training data 60 are sequentially supplied to the learner 62, and the contents of the estimation model 64 are improved stepwise. More specifically, a group of parameters of the estimation model 64 are corrected so that, when the ronchigram 60A is supplied to the estimation model 64, the aberration value 60B corresponding to the ronchigram 60A is output from the estimation model 64.

When the estimation model 64 for the in-advance correction is generated, a variation width of the particular aberration value included in the simulation condition is set large. On the other hand, when the estimation model 64 for the post correction is generated, the variation width of the particular aberration value included in the simulation condition is set small. With such a configuration, an estimation model of a low resolution type can be generated as the estimation model 64 for the in-advance correction, and an estimation model of a high resolution type can be generated as the estimation model 64 for the post correction. The former estimation model is incorporated as the first estimation model in the first estimator, and the latter estimation model is incorporated as the second estimation model in the second estimator.

Figure 4:
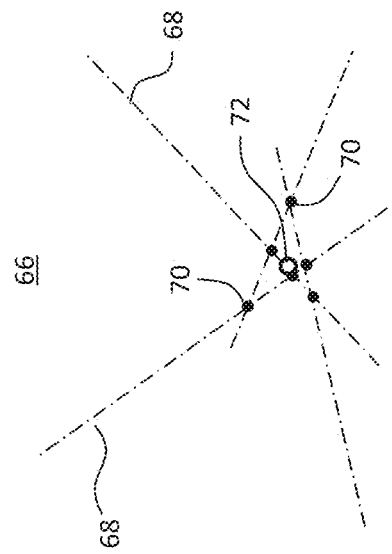
FIG. 4 is a schematic diagram showing an example method of identifying a ronchigram center.

FIG. 4 schematically shows a method of identifying a ronchigram center in the first centering process and the second centering process. The method is executed by the first centering unit and the second centering unit which receive the ronchigram variation image 66.

For example, a plurality of ronchigrams may be acquired while a defocus value is changed stepwise, and the ronchigrams may be accumulated to generate an accumulated ronchigram as the ronchigram variation image 66. The ronchigram variation image 66 may be generated by imaging (integrating) a ronchigram video image while changing the defocus value continuously or stepwise within an imaging period over a certain time period (exposure period). Alternatively, the ronchigram variation image may be generated by other methods.

In the ronchigram variation image 66, each point moves approximately radially from the ronchigram center. More specifically, each point moves away from the ronchigram center or toward the ronchigram center. A plurality of trajectories are generated by motions of a plurality of points. A plurality of straight lines 68 may be extracted by applying a straight line detection method on the ronchigram variation image 66. In this process, known methods may be used such as Hough transform. In FIG. 4, in order to avoid complications of the drawing, a small number of straight lines 68 are shown. Alternatively, each straight line 68 may be detected as a line segment.

Then, a plurality of intersections 70 are identified based on the plurality of straight lines 68. Normally, the plurality of intersections 70 are concentrated near a ronchigram center 72. For example, a center of gravity of the plurality of intersections 70 is determined as the ronchigram center 72.

During the execution of the first centering process, the variation width of the defocus value (first defocus range) is set large, and, during the execution of the second centering process, the variation width of the defocus value (second defocus range) is set small. That is, the first defocus range is greater than the second defocus range. With this configuration, a low resolution type centering process can be executed as the first centering process, and a high resolution type centering process can be executed as the second centering process.

When the ronchigram center is determined, the operation of the deflection scanner is controlled such that the ronchigram center is matched with the imaging center. Alternatively, the ronchigram center may be matched with the imaging center by control of other structures.

Figure 5:
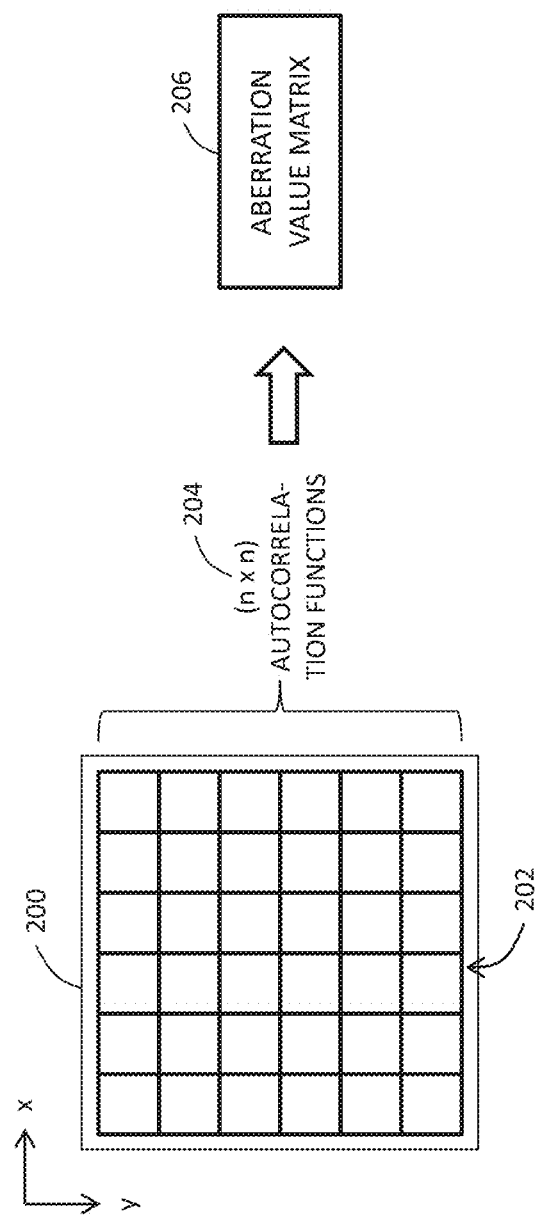
FIG. 5 is a schematic diagram showing an example algorithm for calculating an aberration value matrix.

FIG. 5 is a conceptual diagram showing the SRAM method. A segment array 202 is set for a ronchigram 200. The segment array 202 is formed from, for example, (n×n) segments arranged in a grid-like manner. For each individual segment, an autocorrelation function is calculated. From the segment array 202, (n×n) autocorrelation functions 204 are determined. An aberration value matrix 206 is calculated based on the (n×n) autocorrelation functions 204. Alternatively, the aberration value matrix 206 may be calculated based on (n×n) autocorrelation functions 204 calculated from ronchigrams acquired under under-focus conditions, and (n×n) autocorrelation functions 204 calculated from ronchigrams acquired under over-focus conditions.

Figure 6:
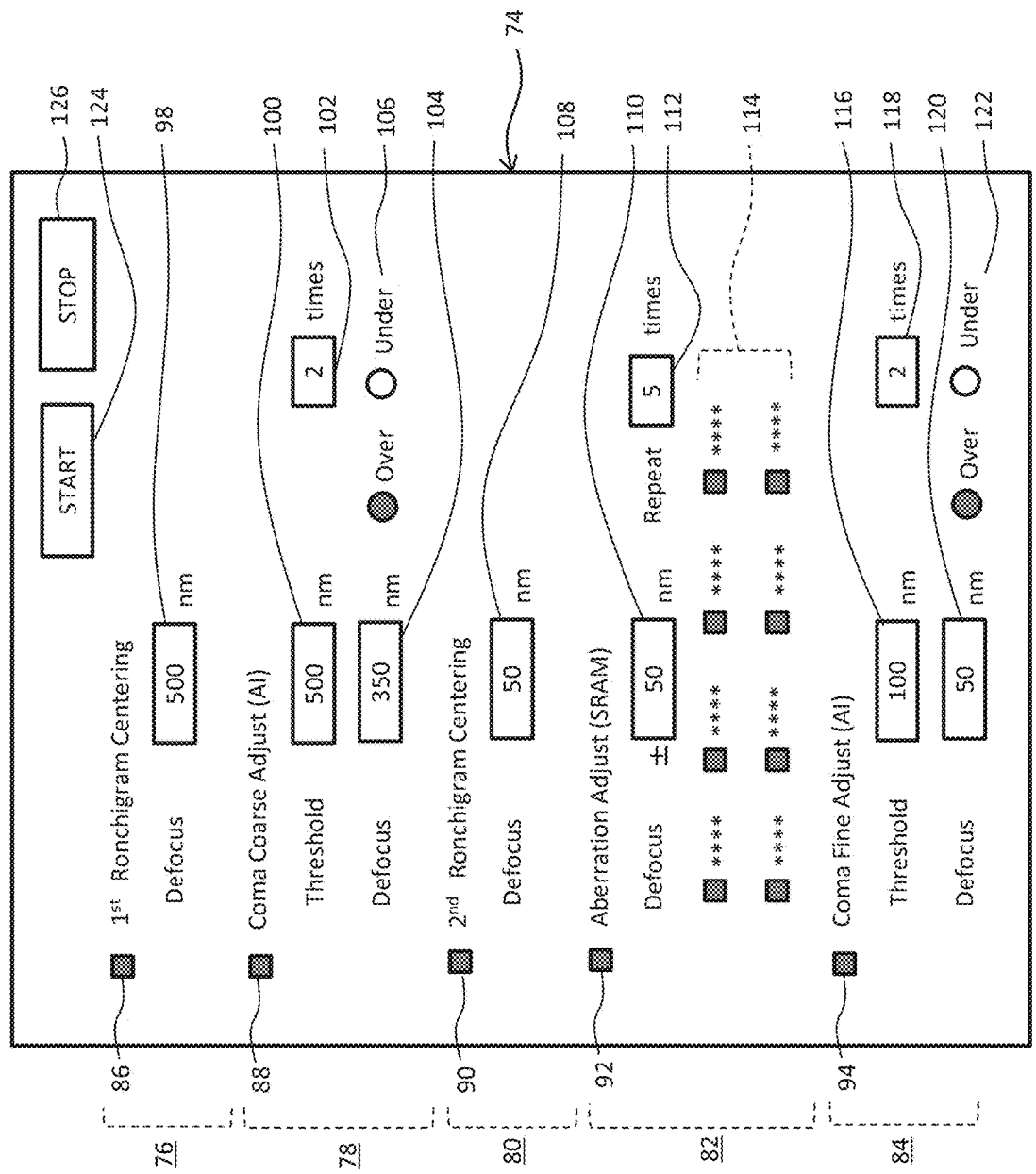
FIG. 6 is a diagram showing an example of a condition setting screen.

FIG. 6 shows an example of a setting image. A setting image 74 is displayed on the display prior to start of execution of the aberration correction process. A user sets the aberration correction condition on the setting image 74. The setting image 74 has a setting area 76 for the first centering process, a setting area 78 for the in-advance correction of the particular aberration, a setting area 80 for the second centering process, a setting area 82 for the primary correction, and a setting area 84 for the post correction of the particular aberration. In the illustrated example, the particular aberration is the second-order coma aberration. Alternatively, other aberrations may be set as the particular aberration. As the other aberration, a two-fold astigmatism may be exemplified. Alternatively, a plurality of aberrations may be set as the particular aberration.

The setting area 76 includes a check box 86, and a defocus range input field 98. When the check box 86 is checked, the first centering process is automatically executed. The defocus range input field 98 is a field for designating a range for changing the defocus value (first defocus range).

The setting area 78 includes a check box 88, a threshold input field 100, a number input field 102, a defocus value input field 104, and a select button pair 106. When the check box 88 is checked, the in-advance correction of the particular aberration is automatically executed. The threshold input field 100 is a field for designating a threshold (first threshold). The number input field 102 is a field for designating a number (first number) serving as a determination value. When a number of consecutive occurrences of a phenomenon that the particular aberration value is lower than the first threshold (consecution number) reaches the first number, the in-advance correction of the particular aberration is completed. Each of the first threshold and the first number is a completion condition or a completion parameter. When the ronchigram is acquired, the defocus value (first defocus value) which is input in the defocus value input field 104 is set under under-focus or over-focus, selected by the select button pair 106. Alternatively, a countermeasure for preventing an infinite loop may be added. For example, a maximum number of loop repetitions may be determined to be a predetermined number (for example, five times).

The setting area 80 includes a check box 90, and a defocus range input field 108. When the check box 90 is checked, the second centering process is automatically executed. The defocus range input field 108 is a field for designating a range for changing the defocus value (second defocus range). The second defocus range is basically smaller than the first defocus range.

The setting area 82 includes a check box 92, a defocus value input field 110, a repetition number input field 112, and an aberration selection field 114. When the check box 92 is checked, the primary correction is automatically repeatedly executed for a number which is input in the repetition number input field 112. For each primary correction, a ronchigram is acquired under over-focus and a ronchigram is acquired under under-focus, based on the defocus value which is input in the defocus value input field 110. The aberration selection field 114 is for selecting one aberration or a plurality of (group of) aberrations to be corrected. Normally, all aberrations are set as the correction target.

The setting area 84 includes a check box 94, a threshold input field 116, a number input field 118, a defocus value input field 120, and a selection button pair 122. When the check box 94 is checked, the post correction of the particular aberration is automatically executed. The threshold input field 116 is a field for designating a threshold (second threshold). The number input field 118 is a field for designating a number (second number) serving as a determination value. When a number of consecutive occurrences of a phenomenon that the particular aberration value is lower than the second threshold (consecution number) reaches the second number, the post correction of the particular aberration is completed. Each of the second threshold and the second number is a completion condition or a completion parameter. When the ronchigram is acquired, the defocus value which is input in the defocus value input field 120 (second defocus value) is set under under-focus or under over-focus, selected by the selection button pair 122. The second threshold is basically smaller than the first threshold. The second defocus value is basically smaller than the first defocus value. Alternatively, a countermeasure for preventing an infinite loop may be added.

In an initial state, all of the check boxes 86, 88, 90, 92, and 94 are checked. In addition, in the initial state, the first defocus range is larger than the second defocus range, the first threshold is larger than the second threshold, and the first defocus value is larger than the second defocus value.

However, in a situation in which the centering process is already completed, the check box 86 may be unchecked, or the check boxes 86 and 90 may be unchecked. In a situation in which the correction of the particular aberration is already completed, the check box 88 may be unchecked, or the check boxes 88 and 94 may be unchecked. In this manner, a sequence of steps of the aberration correction process can be customized on the setting image 74.

The execution of the aberration correction process is started by manipulation of a start button 124. The execution of the aberration correction process is stopped by manipulation of a stop button 126.

Figure 7:
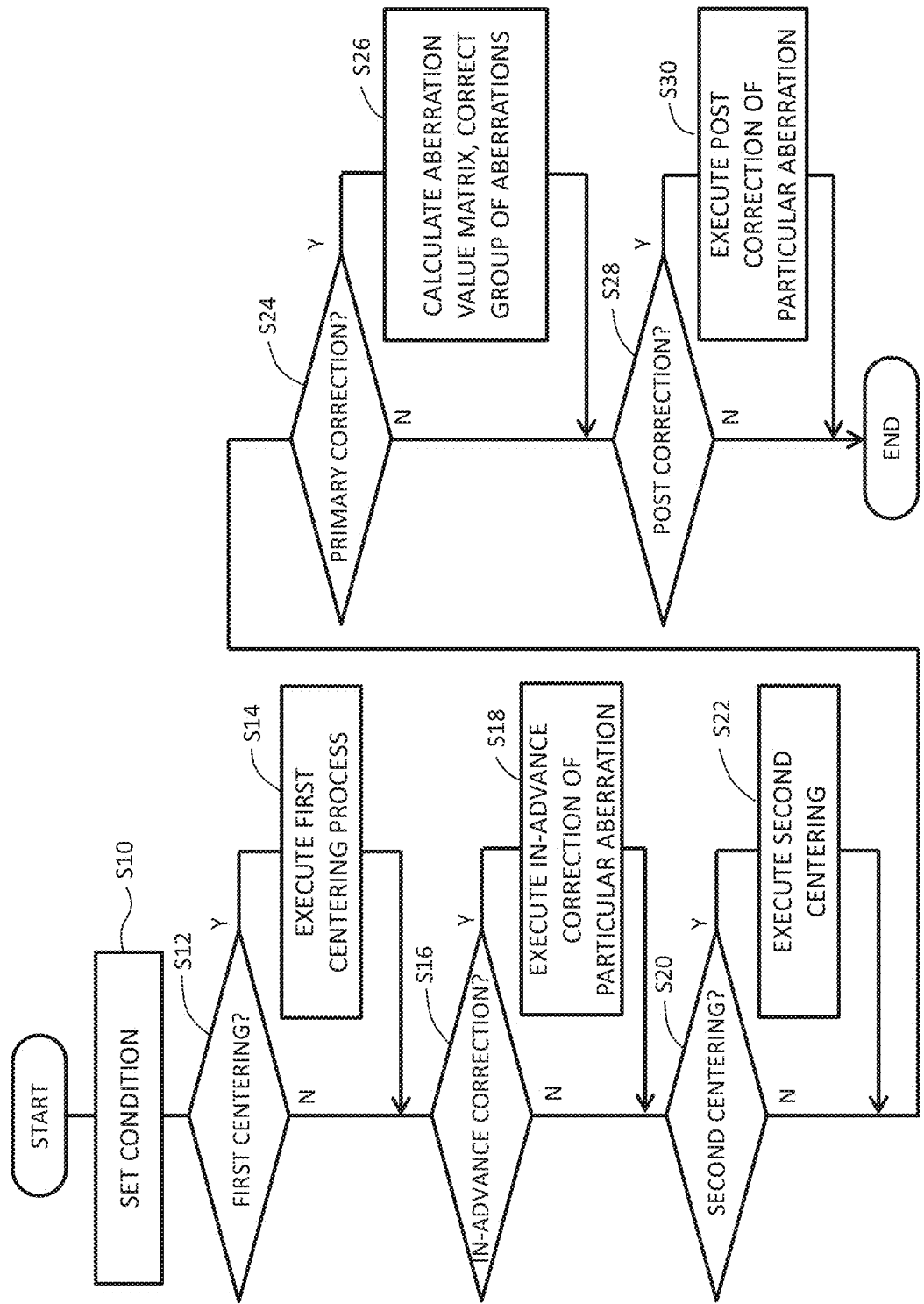
FIG. 7 is a flowchart showing a method of correcting aberration according to an embodiment of the present disclosure.

FIG. 7 shows the aberration correction process (aberration correction method) of the present embodiment as a flowchart. The contents of the flowchart show operations of the information processing unit, and also show the plurality of functions realized by the processor in the information processing unit.

In S10, the aberration correction condition is set by the user on the setting image shown in FIG. 6. In S12, it is judged whether or not execution of the first centering process is set. In S14, the first centering process is executed. The specifics of the process will be described later with reference to FIG. 8. In S16, it is judged whether or not execution of the in-advance correction of the particular aberration is set. In S18, the in-advance correction of the particular aberration is executed. The specifics of the process will be described later with reference to FIG. 9. In S20, it is judged whether or not execution of the second centering process is set. In S22, the second centering process is executed. The specifics of the process will be described later with reference to FIG. 8.

In S24, it is judged whether or not execution of the primary correction is set. In S26, the primary correction is repeatedly executed according to the SRAM method. In each primary correction, for example, two aberration value matrices are calculated based on two ronchigrams, and a group of aberrations are corrected based on the two aberration value matrices. When the first centering process and the in-advance correction of the particular aberration are already executed, the group of aberrations can be corrected based on improved ronchigrams, and, thus, the correction precision can be improved. When the first centering process, the in-advance correction of the particular aberration, and the second centering process are already executed, the group of aberrations can be corrected with higher precision, based on ronchigrams that are improved to a higher degree.

In S28, it is judged whether or not execution of the post correction of the particular aberration is set. In S30, the post correction of the particular aberration is executed. The specifics of the process will be described later with reference to FIG. 9. By executing the post correction of the particular aberration after the primary correction, the correction precision of the particular aberration can be further improved.

After the above-described aberration correction process is completed, an electron microscope image of the sample is acquired. Because the quality of the electron probe can be improved by the execution of the aberration correction process, an electron microscope image having high resolution can be acquired.

Figure 8:
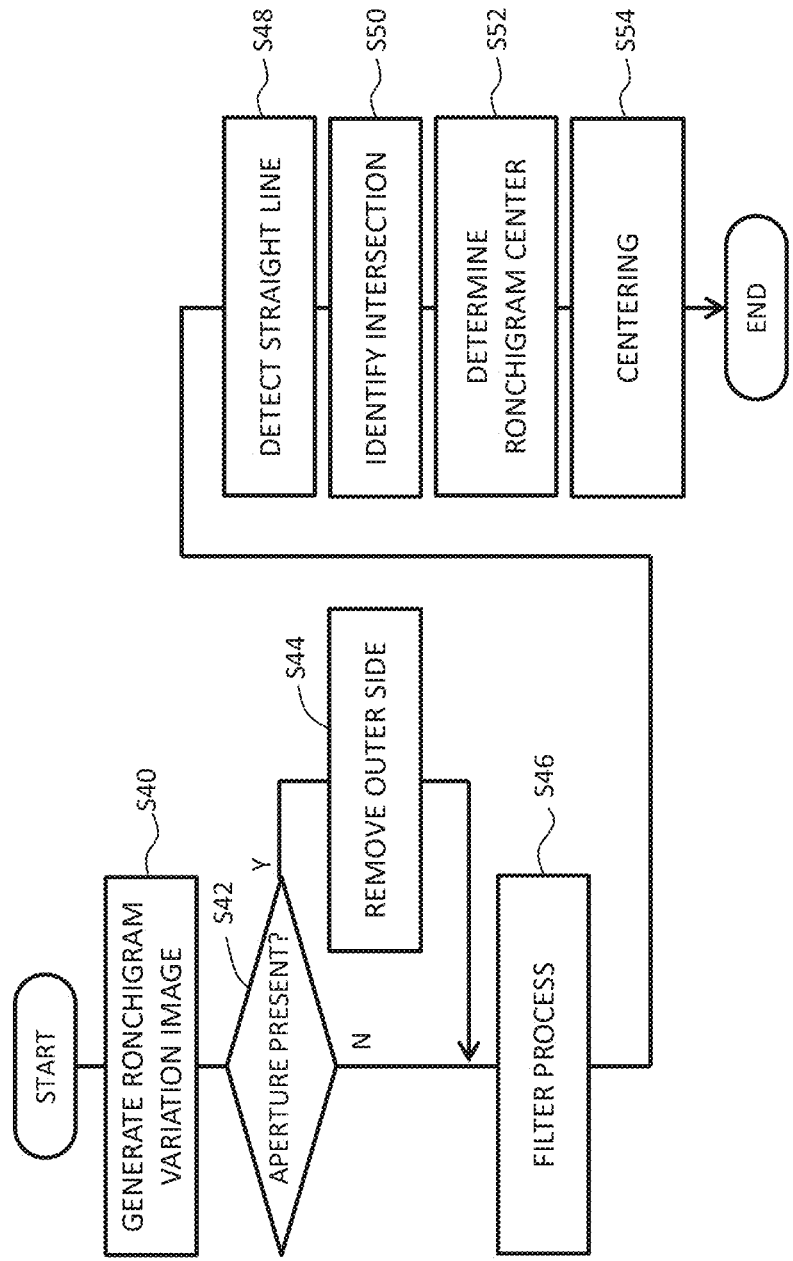
FIG. 8 is a flowchart showing an example of a centering method.

FIG. 8 shows specifics of the first centering process and the second centering process as a flowchart.

As the method of centering, in addition to the method described below, for example, a method described in Document 4 may be utilized. In the method described in Document 4, an immovable point is determined from cross-correlation of two images acquired while the focus is changed. Because of this, it is difficult to apply the method of Document 4 to an image such as the ronchigram of the amorphous region; that is, an image in which a change other than enlargement and reduction occurs due to focus variation. A stage must be moved so that some object is imaged, and then, the centering process must be executed. The method described below is a centering method in which the amorphous region can be set as the observation target without requiring movement of the field of view.

In S40, an electron beam is illuminated onto a sample while the defocus range is stepwise changed within the designated defocus range, to thereby acquire a plurality of ronchigrams. A ronchigram variation image is generated as an accumulated image, through accumulation of the ronchigrams. The number of accumulations may be, for example, designated within a range of four images to a few tens of images.

Alternatively, an electron beam may be continuously illuminated onto a sample while the defocus value is continuously changed within the designated defocus range, to thereby image a ronchigram video image as one ronchigram variation image. A height of focus is changed by changing an excitation current supplied to the objective lens. Alternatively, the height of the focus may be changed by changing a sample position, changing an acceleration voltage of the electron beam, or the like. A value corresponding to the exact focus may or may not be included in the defocus range.

In S42, presence or absence of application of the aperture is judged based on the ronchigram variation image. When it is judged that the aperture is being applied, an outer region other than a circular region in the ronchigram variation image is removed. This is a first pre-process for improving precision of identifying the ronchigram center. The ronchigram variation image may be trimmed stepwise as necessary.

In S46, a filter process is applied to the ronchigram variation image. In this process, for example, a bandpass filter (BPF) is utilized. With the filter process, noise included in the ronchigram variation image is removed or reduced, and a non-uniform contrast component (component derived from a composition of the sample, a thickness of the sample, or the like) included in the ronchigram variation image is removed or reduced. The filter process is a second pre-process for improving the precision of identifying the ronchigram center.

In the ronchigram variation image, each point moves from the ronchigram center to the outer side, or from the outer side toward the ronchigram center. With these movements, a plurality of radial trajectories are generated. In S48, a plurality of straight lines are detected based on the plurality of radial trajectories. In S50, a plurality of intersections caused by the plurality of straight lines are identified. In S52, the ronchigram center is determined based on the plurality of intersections. For example, a center of gravity determined from the plurality of intersections is determined as the ronchigram center.

In S54, an operation of the electron beam illumination system, for example, an operation of the deflection scanner, is controlled so that the ronchigram center is matched with the imaging center serving as an immovable point. In the first centering process, basically, the first defocus range, which is large, is set, along with the first threshold, which is large. Therefore, the first centering process is a coarse centering process. On the other hand, in the second centering process, basically, the second defocus range, which is small, is set, along with the second threshold, which is small. Therefore, the second centering process is a fine centering process. A centering process of high precision can be realized by stepwise executing the two centering processes with the in-advance correction step of the particular aberration between the centering processes.

In the present embodiment, the ronchigram center is identified through image analysis. Alternatively, the ronchigram center may be identified using a machine learning type estimator; that is, an AI (Artificial Intelligence) technique.

Figure 9:
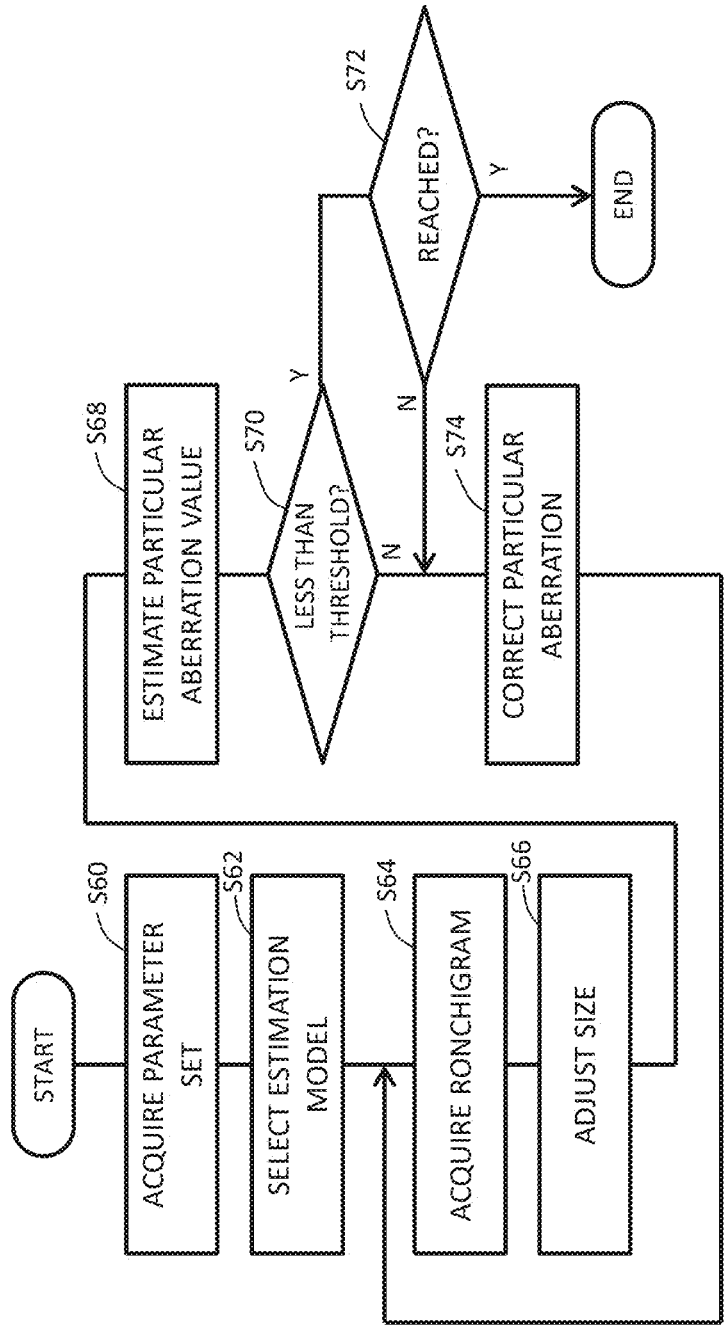
FIG. 9 is a flowchart showing an in-advance correction and a post correction of a particular aberration.

FIG. 9 shows specifics of the in-advance correction and the post correction of the particular aberration as a flowchart. In S60, a parameter set (threshold, number, defocus value, and defocus type) which is set on the setting image is acquired.

In S62, the first estimation model or the second estimation model is selected as the estimation model to be used. In the in-advance correction of the particular aberration, the first estimation model is selected, and, in the post correction of the particular aberration, the second estimation model is selected. The first estimation model is a model which enables estimation of a relatively large particular aberration, and has a first estimation precision. The second estimation model is a model which enables estimation of a relatively small particular aberration, and has a second estimation precision which is higher than the first estimation precision.

In S64, the electron beam is illuminated onto the sample according to the designated defocus value and the designated defocus type, and a ronchigram is thus acquired. In S66, the size of the ronchigram is adjusted in order to fit the size of the ronchigram to the estimation model. In S68, the ronchigram is input to the estimator having the estimation model. With this process, an estimated particular aberration value is output from the estimator.

In S70, it is judged whether or not the estimated particular aberration value is lower than a threshold. When the estimated particular aberration value is greater than or equal to the threshold, in S74, the particular aberration is corrected based on the estimated particular aberration value. Specifically, the operation of the aberration corrector is adjusted so that the particular aberration is reduced. Then, the steps from S64 are again executed.

On the other hand, when it is judged in S70 that the estimated particular aberration value is less than the threshold, in S72, it is judged whether or not the number of consecutive occurrences of the particular aberration value being lower than the threshold (consecution number) has reached the designated number. When the designated number has not been reached, in S74, the particular aberration is corrected similar to the above, and the steps from S64 are again executed. When it is judged in S72 that the designated number has been reached, the in-advance correction or the post correction of the particular aberration is completed. Alternatively, the in-advance correction or the post correction of the particular aberration may be completed immediately when the estimated particular aberration value becomes lower than the threshold.

In the in-advance correction of the particular aberration, the first threshold, which is relatively large, is set, along with the first defocus value, which is relatively large. In the post correction of the particular aberration, the second threshold, which is relatively small, is set, along with the second defocus value, which is relatively small.

Figure 10:
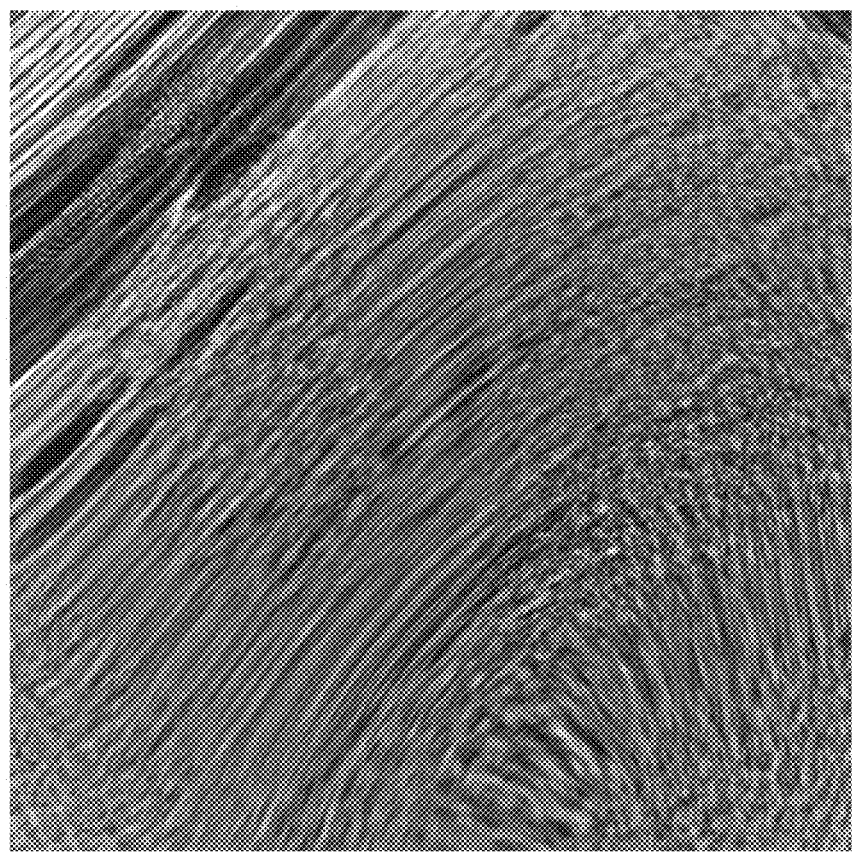
FIG. 10 is a diagram showing an example of a ronchigram before correction of a group of aberrations.
Figure 11:
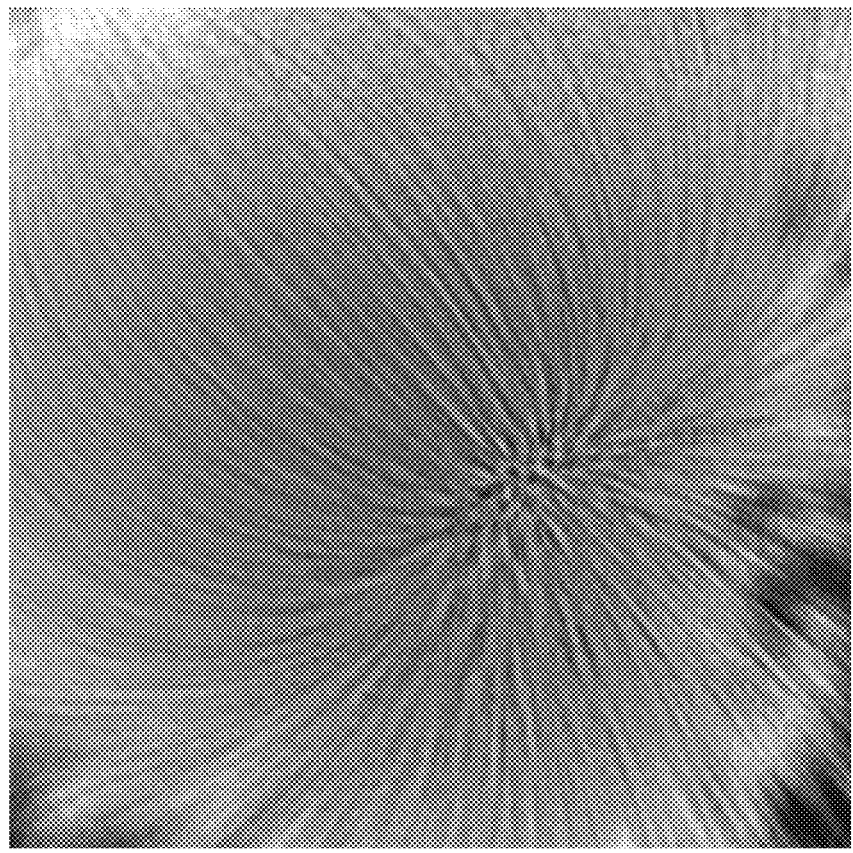
FIG. 11 is a diagram showing an example of a ronchigram variation image.

FIG. 10 shows an example of a ronchigram before the aberration correction process is executed. The ronchigram reflects various aberrations, and it is very difficult to identify the ronchigram center in this ronchigram. FIG. 11 shows an example of a ronchigram variation image acquired during the first centering process. A striped pattern is present in the ronchigram variation image, and the ronchigram center can be narrowed as an immovable point included in the striped pattern.

Figure 12:
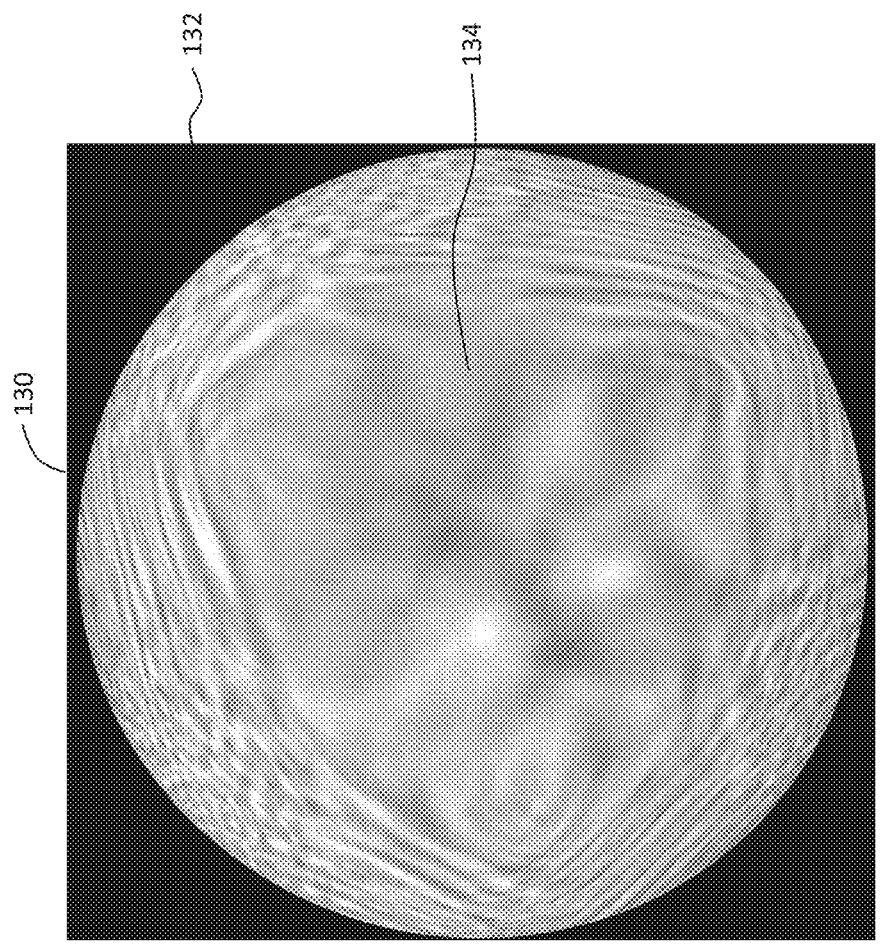
FIG. 12 is a diagram showing a ronchigram after correction of a group of aberrations.

FIG. 12 shows an example of a ronchigram acquired after the execution of the aberration correction process of the present embodiment (the first centering process, the in-advance correction of the particular aberration, the second centering process, the primary correction, and the post correction of the particular aberration). In the illustrated example, an outer region 132 other than a circular region (aperture region) in a ronchigram 130 is removed. The circular region includes a center portion 134 having an almost uniform contrast. The center portion 134 has a significantly large size. This shows that the group of aberrations which can be corrected, other than a plurality of higher order aberrations for which the correction is difficult, have been corrected with high precision.

According to the structure of the embodiment described above, the correction precision of the group of aberrations can be improved in the electron microscope. In addition, the burden of the user for the aberration correction can be reduced. Further, the algorithm for calculating the aberration value matrix can appropriately function.

As an alternative configuration in the embodiment described above, whether or not to execute each of the steps of the aberration correction process may be automatically determined. A machine learning type estimator may be used in the first centering process and the second centering process, and an image analyzer different from a machine learning type estimator may be used in the in-advance correction and the post correction of the particular aberration. In the embodiment described above, the second-order coma aberration is taken as the particular aberration, but alternatively, a two-fold astigmatism may be taken as the particular aberration, or both the second-order coma aberration and the two-fold astigmatism may be taken as the particular aberration. For the primary correction, methods other than the SRAM method may be applied.

The invention claimed is:

1. An electron microscope comprising:
an imaging unit configured to acquire a ronchigram generated as a result of illumination of an electron beam onto a sample;
a centering unit configured to control a centering process to match a ronchigram center with an imaging center based on the ronchigram acquired by the imaging unit;
an in-advance correction unit configured to control an in-advance correction of a particular aberration caused in an electron beam illumination system, based on a ronchigram acquired by the imaging unit after the centering process; and
a primary correction unit configured to control correction of a group of aberrations formed from a plurality of aberrations caused in the electron beam illumination system, based on a ronchigram acquired by the imaging unit after the in-advance correction of the particular aberration.

2. The electron microscope according to claim 1, further comprising:
a fine centering unit configured to control a fine centering process to match the ronchigram center with the imaging center based on the ronchigram acquired by the imaging unit after the in-advance correction of the particular aberration, wherein
the primary correction unit controls the correction of the group of aberrations based on a ronchigram acquired after the in-advance correction of the particular aberration and the fine centering process.

3. The electron microscope according to claim 2, wherein
the centering unit determines the ronchigram center based on a first ronchigram variation image acquired while a defocus value is changed in a first defocus range, and
the fine centering unit determines the ronchigram center based on a second ronchigram variation image acquired while the defocus value is changed in a second defocus range which is smaller than the first defocus range.

4. The electron microscope according to claim 3, further comprising:
a display processing unit configured to generate a setting screen for setting the first defocus range and the second defocus range.

5. The electron microscope according to claim 1, further comprising:
a post correction unit configured to control a post correction of the particular aberration based on a ronchigram acquired by the imaging unit after the correction of the group of aberrations.

6. The electron microscope according to claim 5, wherein
the in-advance correction unit comprises:
a first estimator which has a first estimation model which has undergone a first machine learning process, and which estimates a first particular aberration value; and
a first control device configured to control the in-advance correction of the particular aberration based on the first particular aberration value, and
the post correction unit comprises:
a second estimator which has a second estimation model which has undergone a second machine learning process, and which estimates a second particular aberration value; and
a second control device configured to control the post correction of the particular aberration based on the second particular aberration value.

7. The electron microscope according to claim 5, further comprising:
a display processing unit configured to generate a setting screen for setting a completion condition for the in-advance correction of the particular aberration, and configured to set a completion condition for the post correction of the particular aberration.

8. The electron microscope according to claim 1, wherein
the primary correction unit comprises:
a calculator configured to execute an algorithm for calculating an aberration value matrix for the group of aberrations based on the ronchigram acquired after the in-advance correction of the particular aberration; and
a control device configured to control the correction of the group of aberrations based on the aberration value matrix.

9. The electron microscope according to claim 1, wherein
the particular aberration is coma aberration.

10. A method of correcting aberration, the method comprising:
- controlling a centering process to match a ronchigram center with an imaging center based on a ronchigram acquired as a result of illumination of an electron beam onto a sample;
- controlling an in-advance correction of a particular aberration caused in an electron beam illumination system, based on a ronchigram acquired after the centering process; and
- controlling correction of a group of aberrations formed from a plurality of aberrations caused in the electron beam illumination system, based on a ronchigram acquired after the in-advance correction of the particular aberration.

11. A non-transitory recording medium storing a program for executing a method of correcting aberration in an information processing device, the program comprising:
- a function of controlling a centering process to match a ronchigram center with an imaging center based on a ronchigram acquired as a result of illumination of an electron beam onto a sample;
- a function of controlling an in-advance correction of a particular aberration caused in an electron beam illumination system, based on a ronchigram acquired after the centering process; and
- a function of controlling correction of a group of aberrations formed from a plurality of aberrations caused in the electron beam illumination system, based on a ronchigram acquired after the in-advance correction of the particular aberration.

* * * * *